US007227374B2

(12) United States Patent
Kang et al.

(10) Patent No.: US 7,227,374 B2
(45) Date of Patent: Jun. 5, 2007

(54) LCD INSPECTION APPARATUS

(75) Inventors: Dong Woo Kang, Gumi-si (KR); Soung Yeoul Eom, Gumi-si (KR); Bong Chul Kim, Daegu-si (KR); Ki Soub Yang, Gumi-si (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/442,746

(22) Filed: May 30, 2006

(65) Prior Publication Data

US 2007/0046319 A1 Mar. 1, 2007

(30) Foreign Application Priority Data

Aug. 30, 2005 (KR) ..................... 10-2005-0080041

(51) Int. Cl.
*G01R 31/00* (2006.01)

(52) U.S. Cl. ..................................................... 324/770

(58) Field of Classification Search ..................... None
See application file for complete search history.

(56) References Cited

U.S. PATENT DOCUMENTS 5,394,098 A * 2/1995 Meyrueix et al. ........... 324/750
7,138,022 B2 * 11/2006 Tsai et al. ..................... 156/64

* cited by examiner

*Primary Examiner*—Ha Tran Nguyen
*Assistant Examiner*—Trung Q. Nguyen
(74) *Attorney, Agent, or Firm*—Brinks Hofer Gilson & Lione

(57) ABSTRACT

A liquid crystal display (LCD) inspection apparatus is provided which is capable of preventing detection of defects from being omitted or degraded due to formation of stains in a certain region of an LCD panel in an inspection of the LCD panel.

16 Claims, 7 Drawing Sheets

LCD INSPECTION APPARATUS

This application claims the benefit of Korean Patent Application No. 10-2005-080041, filed on Aug. 30, 2005, which is hereby incorporated by reference as if fully set forth herein.

BACKGROUND

1. Field of the Invention

The present invention relates to an apparatus that inspects a panel of a liquid crystal display (LCD).

2. Discussion of the Related Art

Generally, LCD inspection apparatuses are adapted to easily inspect, with the naked eye, whether or not an LCD panel is defective.

FIGS. 1 and 2 illustrate a conventional LCD inspection apparatus. As shown in FIGS. 1 and 2, the conventional LCD inspection apparatus includes a body 1, an inspection stage 2 arranged at one side of the body 1, to perform an inspection of an LCD panel 10, to be inspected, and a loading/unloading stage 7 which is arranged at the other side of the body 1, to load the LCD panel 10, to be inspected, in the inspection stage 2, and to unload the inspected LCD panel 10 from the inspection stage 2.

As seen in FIG. 2, the LCD inspection apparatus includes a carrier 9 which is mounted to the body 1 such that the carrier 9 is laterally movable. The carrier transfer, the LCD panel 10 from the loading/unloading stage 7 to the inspection stage 2, or from the inspection stage 2 to the loading/unloading stage 7.

The inspection stage 2 includes probe units 3, and a worktable 4 which brings the LCD panel 10 into contact with the probe units 3. The worktable 4 also provides light. The worktable 4 includes a polarizing unit 4*a* and a backlight 4*b* which are arranged at a front portion of the worktable 4, in this order. A moving stage 5 is arranged at the rear of the worktable 4, and is connected to the probe units 3 in a state of being aligned with the probe units 3.

A sub table 8 is mounted to the loading/unloading stage 7. The sub table 8 functions to incline the LCD panel 10 transferred from a loader (not shown) of the loading/unloading stage 7 by a predetermined angle (for example, 60°).

A microscope 6 is mounted to the body 1 in front of the inspection stage 2 such that the microscope 6 is movable in vertical and lateral directions. When it is determined, in a macroscopic inspection operation, that the LCD panel 10 has defects, the operator can more precisely identify the defects of the LCD panel 10, using the microscope 6.

An inspection procedure carried out in the above-mentioned conventional LCD inspection apparatus will be described in brief.

A LCD panel 10 to be inspected is transferred from the loader (not shown) of the loading/unloading stage 7 to the sub table 8 which, in turn, transfers the LCD panel 10 to the carrier 9 while being inclined by a predetermined angle. Subsequently, the carrier 9 feeds the LCD panel 10 to the inspection stage 2. When the LCD panel 10 is placed in the inspection stage 2, the worktable 4 is moved toward the LCD panel 10 in accordance with operation of the moving stage 5. The worktable 4 vacuum-chucks the LCD panel 10 such that the LCD panel 10 is maintained in a fixed state, and then connects pads (not shown) of the fixed LCD panel 10 to lead pins (not shown) of the probe units 3, respectively.

When electrical connection is achieved between the LCD panel 10 and the probe units 3, as mentioned above, a predetermined image signal from a pattern generator is input to the LCD panel 10 via the probe units 3. The pattern generator, which is an external image signal input unit, sequentially provides various image patterns. When the LCD panel 10 is illuminated by the backlight 4*b*, such various image patterns are sequentially displayed on the LCD panel 10. Accordingly, the operator can determine whether or not the LCD panel 10 is defective, through the displayed patterns.

As shown in FIG. 3A, the polarizing unit 4*a* of the above-mentioned conventional LCD inspection apparatus includes a polarizing plate 42, a diffusing plate 43, and a light guide plate 44 which are laminated over one another in a uniformly-spaced state.

In the polarizing unit 4*a* having the above-mentioned structure the diffusing plate 43 may be expanded due to hot air generated during light emission of the backlight unit 4*b* carried out in an inspection of the LCD panel 10, as shown in FIG. 3B. Due to the expansion of the diffusing plate 43, non-uniform gap regions "a" are formed in gaps between the diffusing plate 43 and the polarizing plate 42 and between the diffusing plate 43 and the light guide plate 44. Such non-uniform gap regions "a" may be exhibited in the form of stains in an image displayed on the LCD panel 10 in the inspection of the LCD panel 10.

Boundary regions of stains present in an image displayed on the LCD panel 10 in an inspection of the LCD panel 10 are excluded from inspection regions. This is because the stain boundary regions are detected as defects.

Since no inspection is carried out for the stain boundary regions, there is a problem in that it is impossible to detect substantial defects, for example, point defects (PDs) or line defects (LDs), present in the stain boundary regions.

In order to detect substantial defects present in the non-inspected regions, an additional precise inspection must be carried out for the non-inspected regions. In this case the total task time (namely, the total inspection time for the LCD panel) is increased.

SUMMARY

The present invention is directed to an LCD inspection apparatus that substantially obviates one or more problems due to limitations and disadvantages of the related art.

A LCD inspection apparatus is provided that comprises a worktable with a forwardly-open hollow box structure that supports an LCD panel seated on a front side of the worktable. On the front side of the worktable probe units are arranged and are electrically connected to pads of the LCD panel supported by the worktable. At a rear side of the worktable a backlight unit is arranged inside the worktable and is adapted to emit light toward the LCD panel. At the front side of the worktable a polarizing unit is arranged inside the worktable to polarize light. The polarizing unit includes a first glass sheet. A polarizing plate coated over a front surface of the first glass sheet such that the polarizing plate is integrated with the first glass sheet. A diffusing plate formed at a back surface of the first glass sheet such that the diffusing plate is integrated with the first glass sheet, and a light guide plate arranged at a rear surface of the diffusing plate.

In another embodiment of the present invention, an LCD inspection apparatus comprises a polarizing unit adapted to polarize light supplied to an LCD panel. The polarizing unit includes a first glass sheet. A polarizing plate coated over a front surface of the first glass sheet such that the polarizing plate is integrated with the first glass sheet. A diffusing plate formed at a back surface of the first glass sheet such that the diffusing plate is integrated with the first glass sheet, and a light guide plate arranged at a rear surface of the diffusing plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention associated with an LCD inspection apparatus according to the present invention, examples of which are illustrated in the FIGS. 4 to 6. Wherever possible, the same reference numbers will be used throughout the drawings to refer to the same or like parts.

Figure 1:
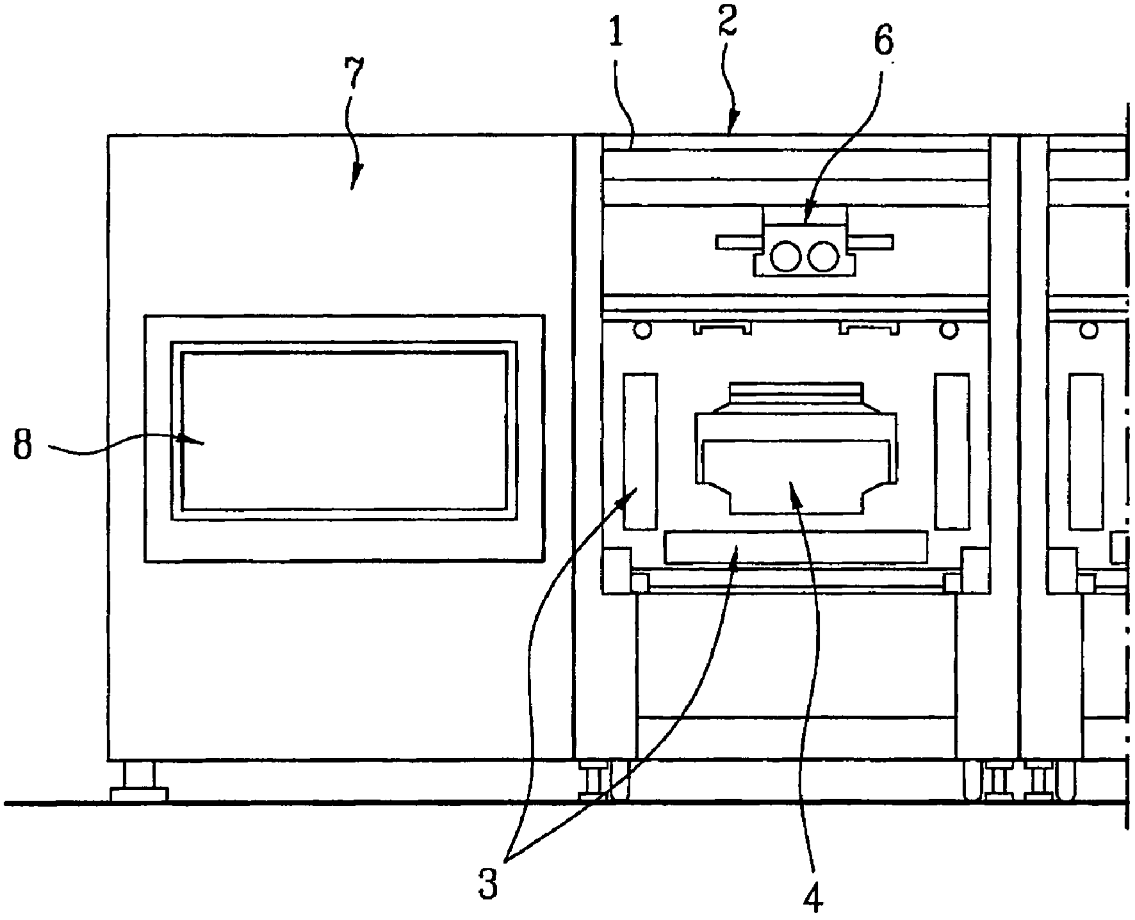
FIG. 1 Related Art
FIG. 1 is a front view schematically illustrating a conventional LCD inspection apparatus.
Figure 2:
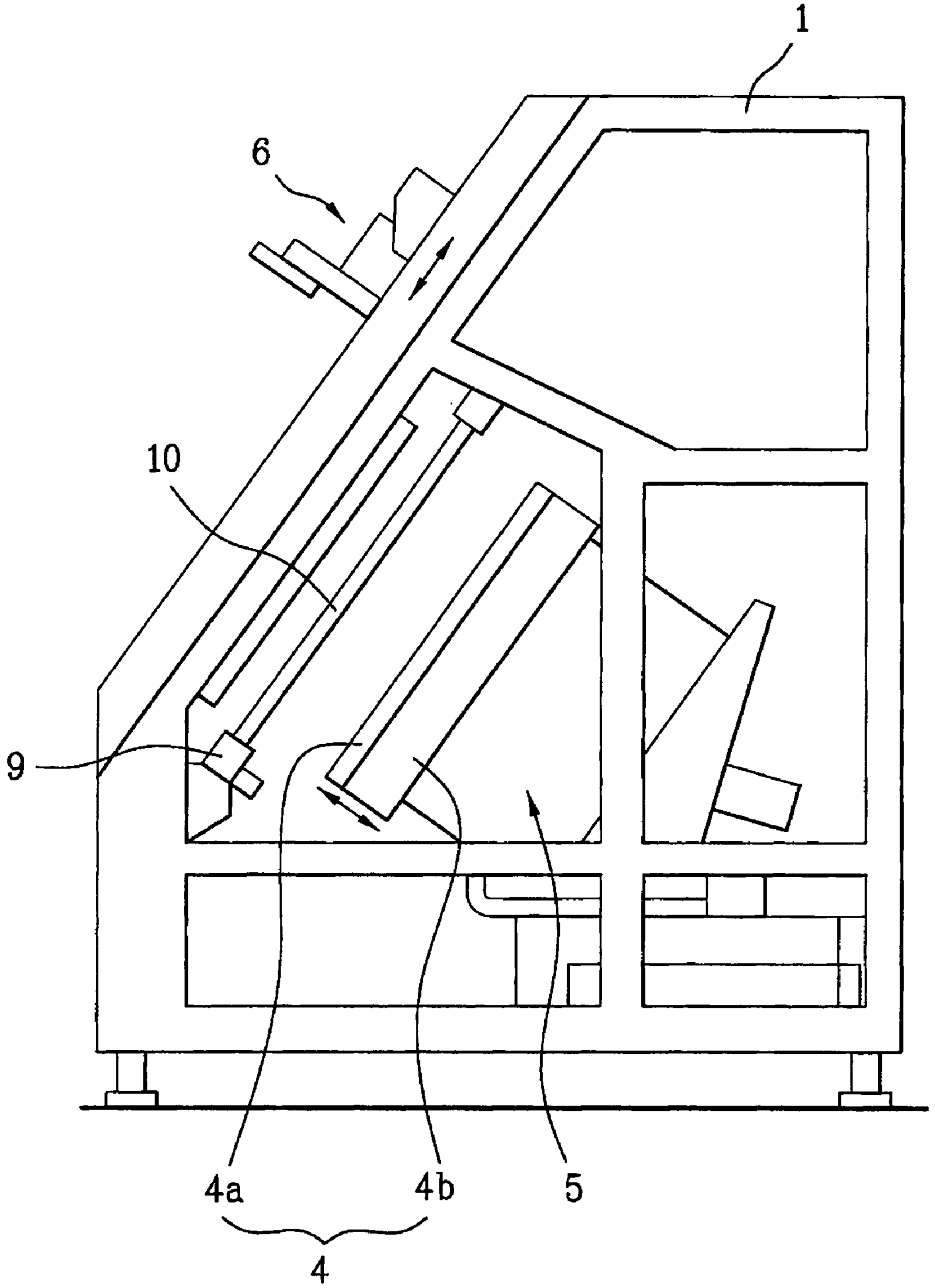
FIG. 2 Related Art
FIG. 2 is a side view of the LCD inspection apparatus shown in FIG. 1.
Figure 3A:
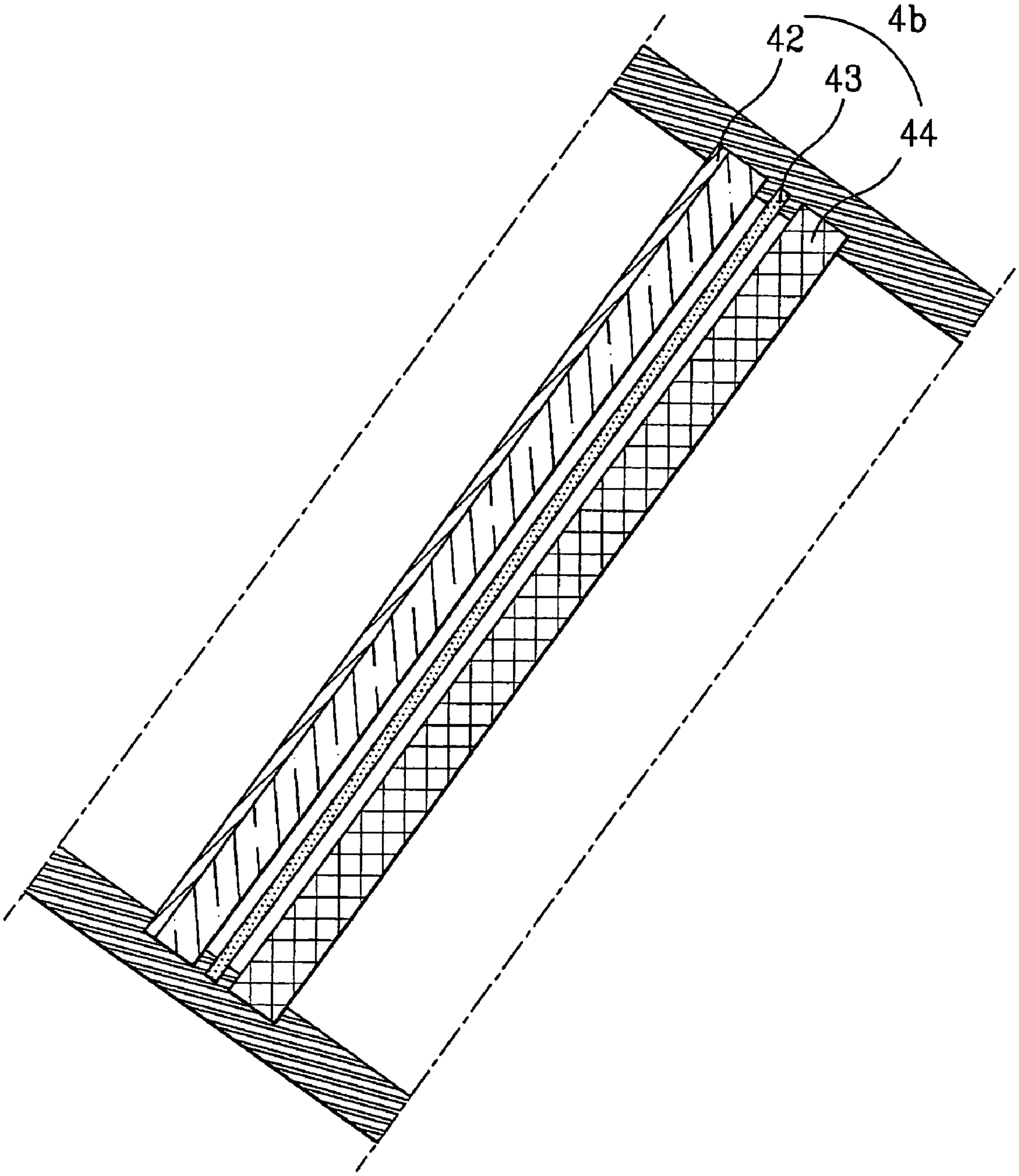
FIG. 3A Related Art
FIGS. 3A and 3B are enlarged sectional views illustrating a detailed structure of a polarizing unit included in the conventional LCD inspection apparatus.
Figure 3B:
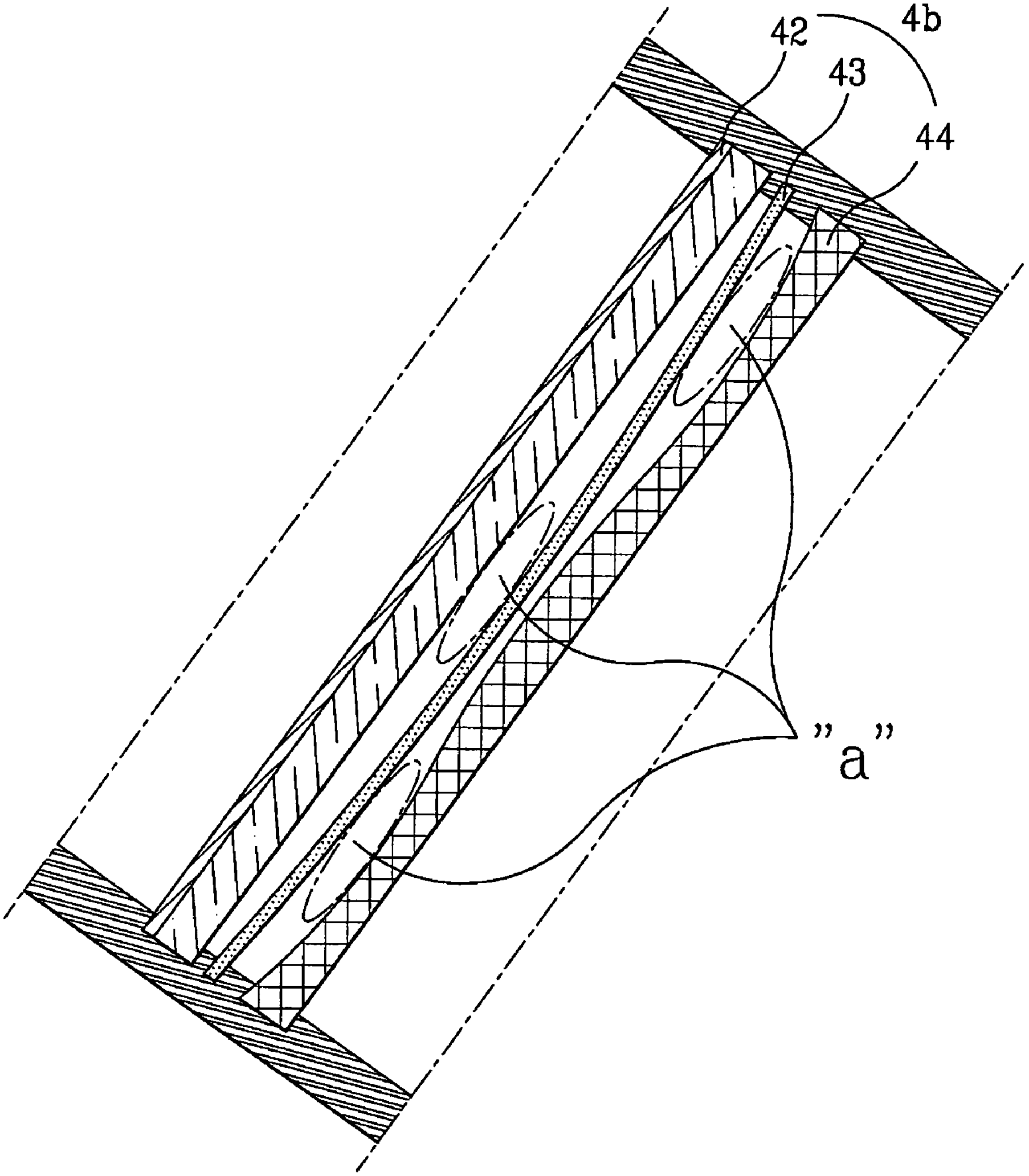
FIG. 3B Related Art
Figure 4:
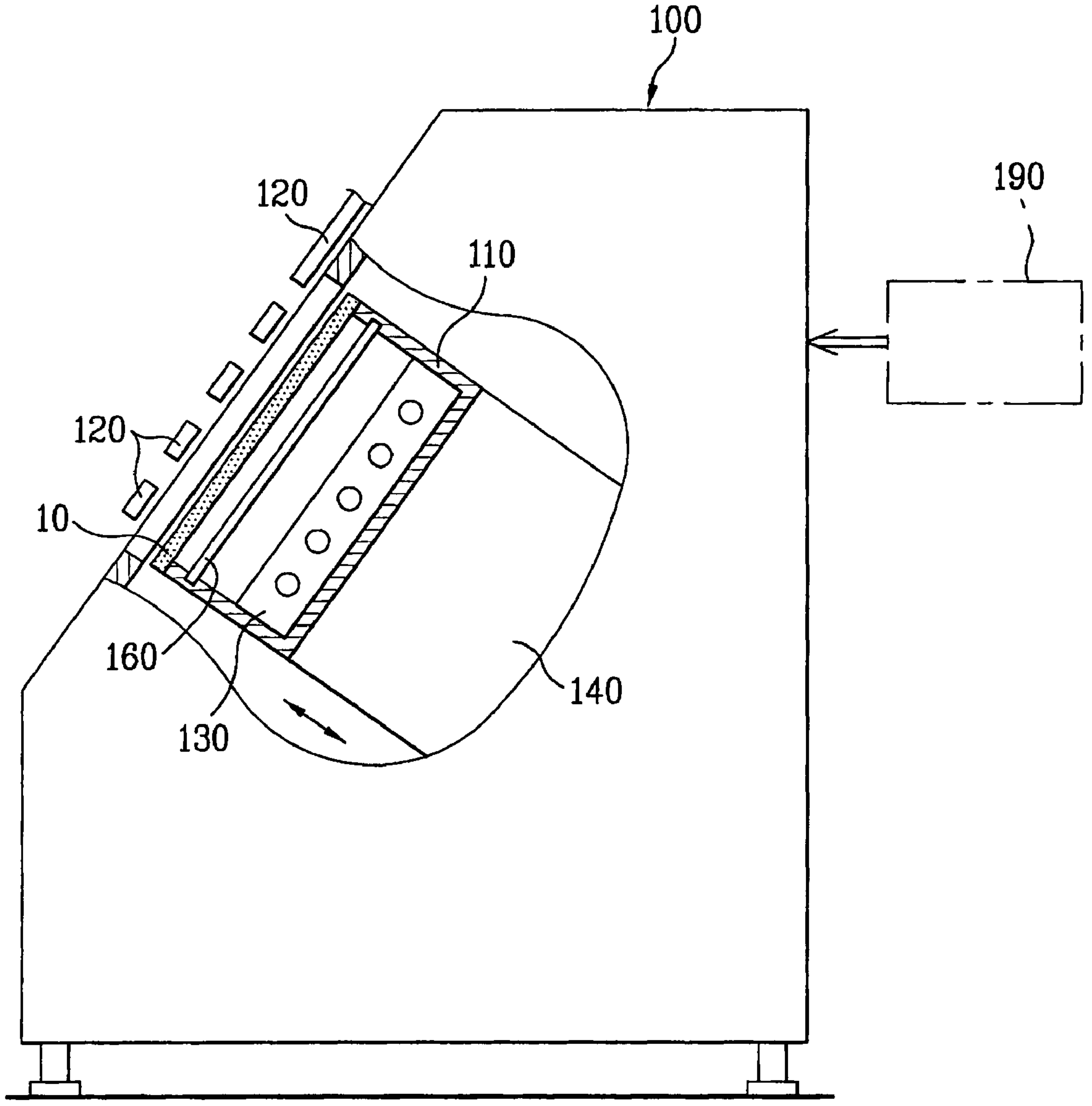
FIG. 4 is a lateral sectional view schematically illustrating an LCD inspection apparatus according to a first embodiment of the present invention.

FIG. 4 is a lateral sectional view schematically illustrating an LCD inspection apparatus according to a first embodiment of the present invention. As shown in FIG. 4, the LCD inspection apparatus according to the first embodiment of the present invention mainly includes a worktable 110, probe units 120, a backlight unit 130, and a polarizing unit 160.

The worktable 110 has a substantially-square hollow box structure which is longitudinally open. An LCD panel 10 is seated on a front side of the worktable 110.

The probe units 120 are arranged in front of the front side of the worktable 110. The probe units 120 receive image signals of various patterns for inspection of the LCD panel 10 from a pattern generator 153, and supply the received image signals to the LCD panel 10.

The LCD inspection apparatus also includes a moving stage 140 which is arranged outside the worktable 110 at the rear of the worktable 110. The moving stage 140 functions to align the worktable 110 with the probe units 120, and to connect the worktable 110 to the probe units 120.

The backlight unit 130 is arranged in the worktable 110 at the rear side of the worktable 110, to supply light to the LCD panel 10 seated on the front side of the worktable 110. Preferably, the backlight unit 130 includes a lamp which is one of a cold fluorescent lamp (CFL), a cold cathode fluorescent lamp (CCFL), an external electrode fluorescent lamp (EEFL), and a high-brightness light emitting diode (LED). It is preferred that the backlight unit 130 be integrated with the worktable 110.

The polarizing unit 160 is arranged inside the worktable 110 at the front side of the worktable 110. The polarizing unit 160 functions to polarize light emitted from the backlight unit 130, and to guide the polarized light to be irradiated to the LCD panel 10.

Figure 5:
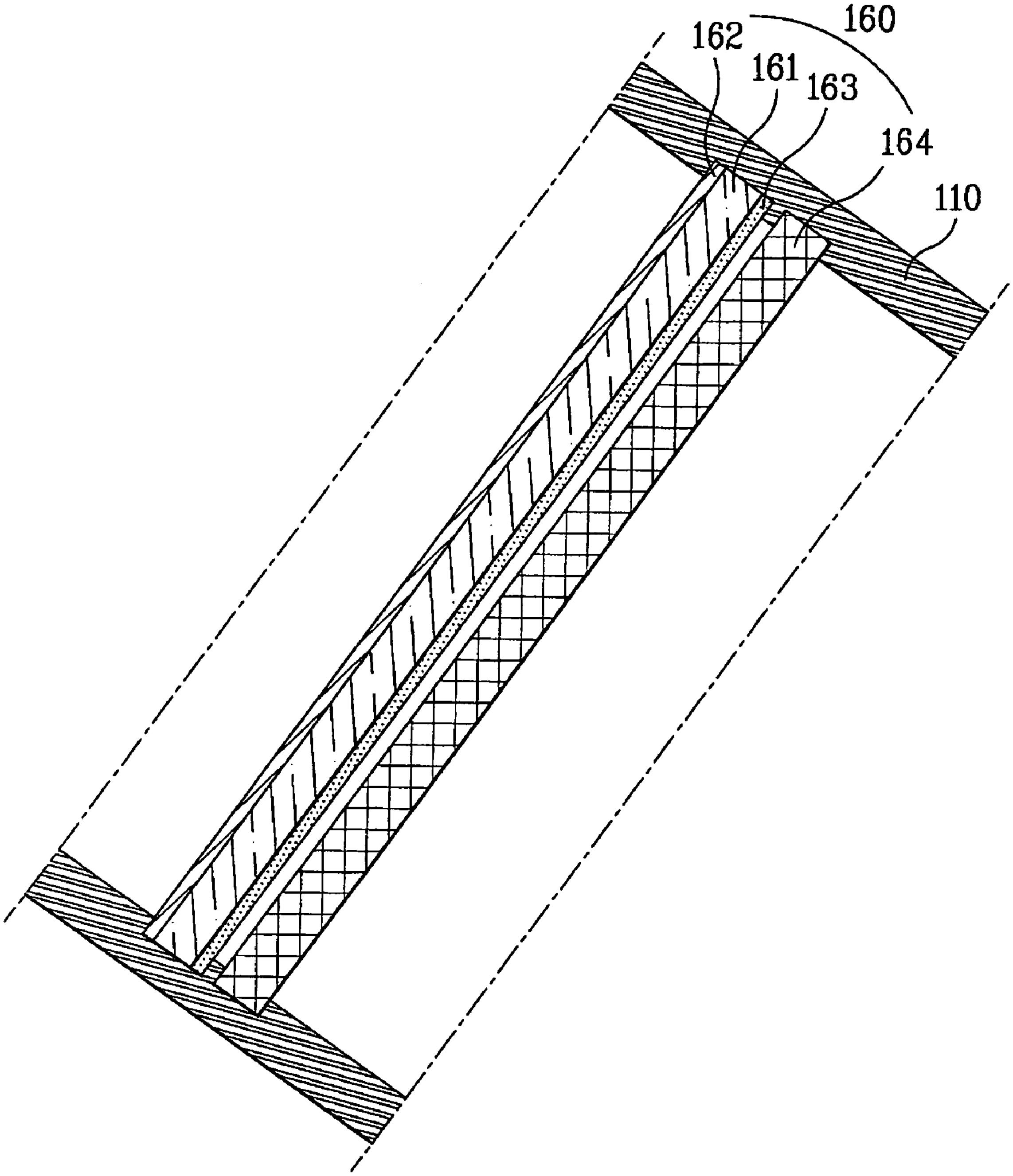
FIG. 5 is an enlarged sectional view illustrating a detailed structure of a polarizing unit included in the LCD inspection apparatus according to the first embodiment of the present invention.

FIG. 5 is a lateral sectional view illustrating a detailed structure of the polarizing unit 160.

In accordance with the first embodiment of the present invention, the polarizing unit 160 mainly includes a first glass sheet 161, a polarizing plate 162, a diffusing plate 163, and a light guide plate 164. Preferably, the first glass sheet 161 is made of heat-resistant glass having a low thermal expansion coefficient.

The polarizing plate 162 changes the optical path of light emitted from the backlight unit 130 such that the light is incident to the LCD panel 10. The polarizing plate 162 is coated over a front surface of the first glass sheet 161 such that the polarizing plate 162 is integrated with the first glass sheet 161.

The diffusing plate 163 functions to diffuse the light incident to the LCD panel 10, in order to enhance the uniformity of the incidence light. The diffusing plate 163 is integrated with a back surface of the first glass sheet 161.

The diffusing plate 163 is coated over the back surface of the first glass sheet 161 in the form of a thin film such that the diffusing plate 163 is integrated with the first glass sheet 161.

The diffusing plate 163 may be formed to have an adhesive front surface. The diffusing plate 163 can be bonded, at the adhesive front surface thereof, to the back surface of the first glass sheet 161 so that the diffusing plate 163 can be integrated with the first glass sheet 161.

The light guide plate 164 functions to uniformly scatter the light emitted from the backlight unit 130 over a wide area. The light guide plate 164 is arranged at a back surface of the diffusing plate 163.

Although not shown, the light guide plate 164 may also be integrated with the diffusing plate 163. In this case, the polarizing plate 162, first glass sheet 161, diffusing plate 163, and light guide plate 164 form an integrated structure.

A procedure for supplying light emitted from the backlight unit 130 to the LCD panel 10 in an inspection of the LCD panel 10 carried out using the above-described LCD inspection apparatus according to the first embodiment of the present invention will be described in detail.

When the worktable 110 is forwardly moved in accordance with a driving operation of the moving stage 140 under the condition in which the LCD panel 10 has been seated on the front side of the worktable 110, electrical connection is achieved between the LCD panel 10 and the probe units 120. Image signals of various patterns are sequentially applied from the pattern generator 190 to the LCD panel 10 via the probe units 120. The backlight unit 130 then emits light which is, in turn, scattered over a wide area while passing through the light guide plate 164. The scattered light is then uniformly diffused while passing through the diffusing plate 163. Subsequently, the light passes through the first glass sheet 161 and polarizing plate 162, in this order. The light emerging from the polarizing plate 162 is irradiated to the LCD panel 10 in a polarized state.

During the above-described procedure, the interior of the worktable 110 is heated to a high temperature due to the light emission of the backlight unit 130. However, the diffusing plate 163 exhibits no or little deformation caused by thermal expansion because it is coated over the first glass sheet 161 made of heat-resistant glass in an integrated state.

Thus, no stain is formed in each pattern image displayed on the LCD panel 10. Accordingly, it is possible to prevent detection of defects from being omitted due to formation of stains.

Figure 6:
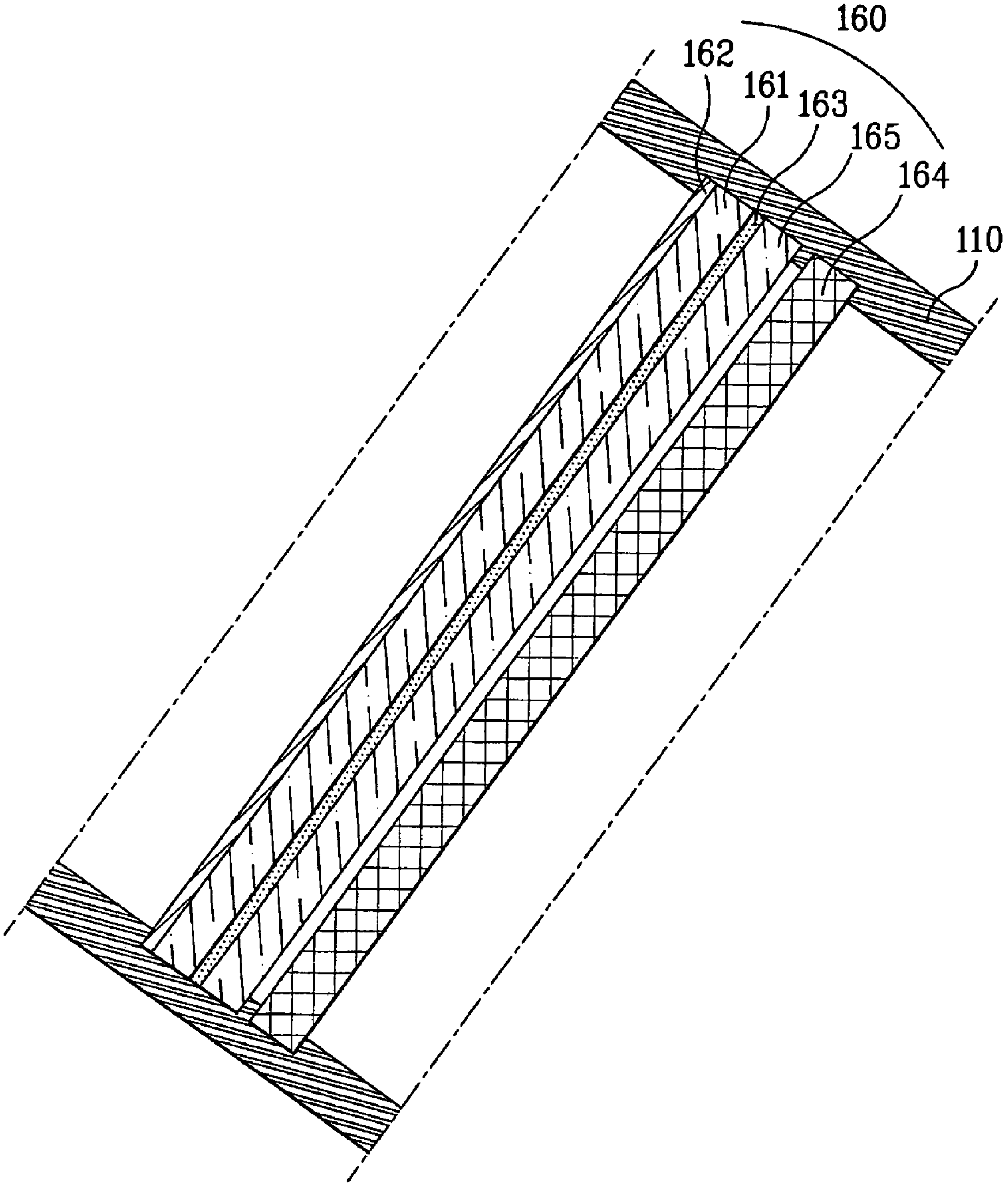
FIG. 6 is an enlarged sectional view illustrating a detailed structure of a polarizing unit included in an LCD inspection apparatus according to a second embodiment of the present invention.

FIG. 6 illustrates a polarizing unit according to a second embodiment of the present invention.

As shown in FIG. 6, the polarizing unit 160 according to the second embodiment of the present invention includes a second glass sheet 165, in addition to the configuration according to the first embodiment of the present invention.

The second glass sheet 165 is integrated with the back surface of the diffusing plate 163. Preferably, the diffusing plate 163 is coated, at the back surface thereof, over a front surface of the second glass sheet 165.

Although not shown, the light guide plate 164 may be integrated with a back surface of the second glass sheet 165. Thus, the polarizing plate 162, first glass sheet 161, diffusing plate 163, second glass sheet 615, and light guide plate 164 form an integrated structure.

The above-described polarizing unit 160 according to the second embodiment of the present invention has a structure in which the diffusing plate 163 is arranged between the first and second glass sheets 161 and 165 while being integrated with the first and second glass sheets 161 and 165, thereby being capable of further suppressing expansion of the diffusing plate 163 caused by high temperature. The second glass sheet 165 may be made of heat-resistant glass having a low thermal expansion coefficient.

The polarizing unit 160 is not limited to appliances which have the same configuration as the LCD inspection apparatus according to each embodiment of the present invention as described above. For example, the polarizing unit 160 may be applied to arrangements other than the arrangement in which the polarizing unit 160 is arranged inside the worktable 110. The polarizing unit 160 according to each embodiment of the present invention may be applied to modular appliances (for example, LCD monitors, LCD TVs, or mobile phones). Thus, the polarizing unit of the present invention is useful in that it is applicable to various arrangements.

As apparent from the above description, the LCD inspection apparatus of the present invention can be implemented in the form of a single modular product because the polarizing unit and backlight unit are arranged in the worktable. Accordingly, the LCD inspection apparatus has an effect capable of achieving a convenient assembly process in the manufacture of the LCD inspection apparatus.

Since the polarizing plate, first glass sheet, and diffusing plate, which constitute the polarizing unit, form an integrated structure in accordance with the present invention, the LCD inspection apparatus of the present invention has an effect capable of suppressing expansion of the diffusing plate caused by hot air generated from the backlight unit.

Since it is possible to positively suppress expansion of the diffusing plate, no stain is formed in an image displayed on the LCD panel during an inspection of the LCD panel. Accordingly, it is possible to prevent detection of defects from being omitted due to formation of stains.

The LCD inspection apparatus according to the second embodiment of the present invention effectively suppresses deformation of the diffusing plate because the polarizing unit further includes the second glass sheet, with which the diffusing plate integrated with the first glass sheet is integrated at the back surface thereof.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display (LCD) inspection apparatus comprising:

a worktable that supports an LCD panel seated on a front side of the worktable;

probe units electrically connected to pads of the LCD panel;

a backlight unit that emits light toward the LCD panel; and a polarizing unit that polarizes light, wherein the polarizing unit includes a first glass sheet, a polarizing plate coated over a front surface of the first glass sheet, a diffusing plate formed at a back surface of the first glass sheet, and a light guide plate arranged at a rear surface of the diffusing plate.

2. The LCD inspection apparatus according to claim 1, wherein the diffusing plate of the polarizing unit is coated over the back surface of the first glass sheet in the form of a thin film that is integrated with the first glass sheet.

3. The LCD inspection apparatus according to claim 1, wherein the polarizing plate is integrated with the first glass sheet.

4. The LCD inspection apparatus according to claim 1, wherein the light guide plate of the polarizing unit is integrated with the back surface of the diffusing plate.

5. The LCD inspection apparatus according to claim 1, wherein the worktable has a forwardly-open hollow box structure.

6. The LCD inspection apparatus according to claim 1, wherein the probe units are arranged in the front of the front side of the worktable.

7. The LCD inspection apparatus according to claim 1, wherein the backlight unit is arranged inside the worktable at a rear side of the worktable.

8. The LCD inspection apparatus according to claim 1, wherein the polarizing plate is arranged inside the worktable at a front side of the worktable.

9. The LCD inspection apparatus according to claim 1, wherein the polarizing unit further includes a second glass sheet that is integrated with the back surface of the diffusing plate.

10. A liquid crystal display (LCD) inspection apparatus comprising a polarizing unit adapted to polarize light supplied to an LCD panel, wherein the polarizing unit includes a first glass sheet, a polarizing plate coated over a front surface of the first glass sheet, a diffusing plate formed at a back surface of the first glass sheet, and a light guide plate arranged at a rear surface of the diffusing plate.

11. The LCD inspection apparatus according to claim 10, wherein the polarizing plate of the polarizing unit is integrated with the first glass sheet.

12. The LCD inspection apparatus according to claim 10, wherein the diffusing plate of the polarizing unit is coated over the back surface of the first glass sheet in the form of a thin film that is integrated with the first glass sheet.

13. The LCD inspection apparatus according to claim 12, wherein the light guide plate of the polarizing unit is integrated with the back surface of the diffusing plate.

14. The LCD inspection apparatus according to claim 12, wherein the polarizing unit further includes a second glass sheet which is integrated with the back surface of the diffusing plate.

15. The LCD inspection apparatus according to claim 10, wherein the light guide plate of the polarizing unit is integrated with the back surface of the diffusing plate.

16. The LCD inspection apparatus according to claim 10, wherein the polarizing unit further includes a second glass sheet which is integrated with the back surface of the diffusing plate.

* * * * *

UNITED STATES PATENT AND TRADEMARK OFFICE

CERTIFICATE OF CORRECTION

PATENT NO. : 7,227,374 B2
APPLICATION NO. : 11/442746
DATED : June 5, 2007
INVENTOR(S) : Dong Woo Kang et al.

It is certified that error appears in the above-identified patent and that said Letters Patent is hereby corrected as shown below:

On the Title Page (30)

In column 1, line 1, under "Foreign Application Priority Data", delete "10-2005-0080041" and substitute --P2005-0080041-- in its place.

Signed and Sealed this

Twentieth Day of November, 2007

JON W. DUDAS
*Director of the United States Patent and Trademark Office*